（12） United States Patent
Wang

(10) Patent No.: US 9,111,862 B2
(45) Date of Patent: Aug. 18, 2015

(54) SEMICONDUCTOR APPARATUS AND MANUFACTURING METHOD THEREOF

(75) Inventor: Xinpeng Wang, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 13/431,728

(22) Filed: Mar. 27, 2012

(65) Prior Publication Data

US 2012/0292699 A1    Nov. 22, 2012

(30) Foreign Application Priority Data

May 20, 2011 (CN) .......................... 2011 1 0131061

(51) Int. Cl.
| | |
|---|---|
| H01L 21/02 | (2006.01) |
| H01L 21/28 | (2006.01) |
| H01L 29/423 | (2006.01) |
| H01L 29/66 | (2006.01) |
| H01L 29/78 | (2006.01) |

(52) U.S. Cl.
CPC .... H01L 21/28114 (2013.01); H01L 29/42376 (2013.01); H01L 29/6653 (2013.01); H01L 29/66545 (2013.01); H01L 29/7843 (2013.01); H01L 29/7847 (2013.01)

(58) Field of Classification Search
USPC .................. 257/314–344; 438/197
See application file for complete search history.

(56) References Cited

U.S. PATENT DOCUMENTS

| | | | | |
|---|---|---|---|---|
| 6,524,901 | B1* | 2/2003 | Trivedi ........................ | 438/183 |
| 7,545,004 | B2* | 6/2009 | Yang et al. ................... | 257/369 |
| 2003/0032225 | A1* | 2/2003 | Brown et al. ................. | 438/197 |
| 2004/0104411 | A1* | 6/2004 | Joubert et al. ................ | 257/204 |
| 2006/0228836 | A1* | 10/2006 | Yang et al. ................... | 438/149 |
| 2007/0224745 | A1* | 9/2007 | Chang et al. ................. | 438/197 |

FOREIGN PATENT DOCUMENTS

| | | |
|---|---|---|
| CN | 101071823 | 11/2007 |
| CN | 101390209 | 3/2009 |
| JP | 2001267562 | 9/2001 |
| WO | WO 2006053258 | 5/2006 |

OTHER PUBLICATIONS

Office Action from corresponding Chinese Patent Appl. No. 201110131061.8. dated Jun. 3, 2014.
Office Action from corresponding Chinese Patent Appl No. 201110131061.8, dated Feb. 15, 2015.

* cited by examiner

*Primary Examiner* — Cheung Lee
*Assistant Examiner* — Frederick B Hargrove
(74) *Attorney, Agent, or Firm* — Koppel, Patrick, Heybl & Philpott; Michael J. Ram

(57) ABSTRACT

A semiconductor apparatus and a manufacturing method therefor is described. The semiconductor apparatus comprises a substrate and a gate structure for a N-channel semiconductor device above the substrate. A recess is formed at a lower end portion of at least one of two sides of the gate where it is adjacent to a source region and a drain region, of the N-channel semiconductor. The channel region of the N-channel semiconductor device has enhanced strain. The apparatus can further have a gate structure for a P-channel semiconductor device above the substrate.

9 Claims, 5 Drawing Sheets

SEMICONDUCTOR APPARATUS AND MANUFACTURING METHOD THEREOF

CROSS-REFERENCE TO RELATED APPLICATIONS

This application claims priority to Chinese Patent Application No. 201110131061.8, filed on May 20, 2011 and entitled "Semiconductor Apparatus and Manufacturing Method thereof", which is incorporated herein in its entirety by reference.

BACKGROUND OF THE INVENTION

1. Field of the Invention

The present invention relates to semiconductor technology, and particularly relates to a semiconductor apparatus and a manufacturing method therefore. More specifically, the present invention relates to a semiconductor apparatus comprising an N-channel strained semiconductor device and manufacturing method therefore.

2. Description of the Related Art

With the development of semiconductor technology, the critical dimensions of a device have been continuously reduced. Stress memorization technology has been widely used as a strained device technology to enhance electrical performance of devices.

As known in the art, the amount of stress applied to a three-dimensional structure influences the performance of the final device. For example, an N-channel semiconductor device (such as, an NMOS field effect transistor, also referred to as an NMOS transistor), higher tensile stress can result in higher carrier mobility.

The prior art discloses a stress memorization technology (SMT) for an N-channel semiconductor device. As shown in FIG. 8, a dielectric layer 113 and a gate 101 are formed over a substrate 109. Preferably, a portion of the substrate 109 can include a lightly doped region (LDD) 105. A gate spacer 103 can then be formed along with implantations to form a source region 107 and a drain region 111. After the source region 107 and the drain region 111 implantations, stressing process is performed. The procedure for the stressing process according to the prior art can comprise depositing a stress material (such as silicon nitride) 801 above the substrate 109, performing an SMT etching to maintain the stress material over a N-channel semiconductor device region, annealing so that the stress is retained (i.e., forming strain); and removing the nitride stress material 801.

However, there still exists a need for a semiconductor apparatus comprising a semiconductor device having an enhanced strain and a manufacturing method therefore.

SUMMARY

In view of the aforementioned needs, the current disclosure provides a semiconductor apparatus comprising a semiconductor device having enhanced strain and a manufacturing method therefore.

According to one aspect of the present invention, there is provided a semiconductor apparatus comprising a substrate and a gate structure for an N-channel semiconductor device over the substrate, wherein a channel region of the N-channel semiconductor device is under enhanced strain. The gate structure for the N-channel semiconductor device includes a dielectric layer over the substrate and a gate over the dielectric layer. A recess is formed at a lower end portion of at least one of two sides of the gate, the two sides being adjacent to a source region and a drain region of the N-channel semiconductor device.

In a sample of the invention, the gate structure further comprises a sidewall on the at least one side of the gate above the respective recess.

In a sample of the invention, the gate structure is used for a stressing process on the channel region.

In a sample of the invention, the stressing process comprises covering the substrate and the gate structure with a stress material so that the recess is filled with the stress material and annealing the stress material.

In an embodiment of the invention, the semiconductor apparatus further comprises the semiconductor apparatus further comprises a gate structure for a P-channel semiconductor device over the substrate.

In an embodiment of the invention, the stressing process further comprises, after covering but before annealing, removing a part of the stress material that covers a region of the substrate for the P-channel semiconductor device.

In an embodiment of the invention, the gate is a metal gate, a poly-silicon gate, or a dummy gate.

In an embodiment of the invention, a vertical size (a) of the recess is less than or equal to 25% of a vertical size of the gate.

In an embodiment of the invention, a lateral size (b) of the recess is less than or equal to 20% of a lateral size of the gate.

In an embodiment of the invention, the substrate further comprises a LDD region, wherein a lateral size (b) of the recess is less than or equal to a lateral size of a portion of the LDD region that is located below the gate.

According to another aspect of the present invention, there is provided a method for manufacturing a semiconductor apparatus, comprising providing a substrate, forming a gate structure for an N-channel semiconductor device over the substrate. The gate structure for the N-channel semiconductor device includes a dielectric layer over the substrate and a gate over the dielectric layer, wherein the gate is formed with a recess at a lower end portion of at least one of two sides of the gate the portions being adjacent to a source region and a drain region; and performing a stressing process with use of the gate structure.

In an embodiment of the invention, the stressing process comprises covering the substrate and the gate structure with a stress material so that the recess is filled with the stress material and annealing the stress material.

In an embodiment of the invention, the method further comprises forming a gate structure for a P-channel semiconductor device over the substrate. The stressing process further comprises after covering and before annealing, removing a part of the stress material that covers a region of the substrate for the P-channel semiconductor device.

In an embodiment of the invention, forming a gate structure for an N-channel semiconductor device comprises forming an initial structure over the substrate, the initial structure including a dielectric layer over the substrate, a gate over the dielectric layer, and a first gate spacer for the gate. The first gate spacer is partially etched at its lower end to expose a portion of the gate, and then the exposed portion of the gate is etched to form the recess.

In an embodiment of the invention, the gate is a metal gate, a poly-silicon gate, or a dummy gate.

In an embodiment of the invention, a lateral size of the recess is less than or equal to 20% of a lateral size of the gate.

In an embodiment of the invention, a vertical size of the recess is less than or equal to 25% of a vertical size of the gate.

In an embodiment of the invention, the substrate further comprises a LDD region, wherein a lateral size (b) of the recess is less than or equal to a lateral size of a portion of the LDD region that is below the gate.

Further aspects, advantages, and features of the present invention will be easily understood from the following detailed description of exemplary embodiments according to the present invention.

BRIEF DESCRIPTION OF THE DRAWINGS

The accompanying drawings, which are incorporated in and constitute a part of the specification, illustrate embodiments of the invention and, together with the description, serve to explain the principles of the invention. The present invention will be easily understood by reading the following descriptions with reference to the drawings, in which.

It should be appreciated that these drawings are merely illustrative and are not intended to limit the scope of the present invention. In the figures, various elements have not been drawn strictly to scale or according to their actual shapes. Some elements (e.g. layers or parts) can be magnified with respect to other elements for the purpose of more clearly explaining the principles of the present invention. Moreover, those details that would otherwise obscure the gist of the present invention are not shown in the figures.

DESCRIPTION OF THE EMBODIMENTS

The embodiments of the present invention will be described in detail below with reference to the drawings.

Figure 1:
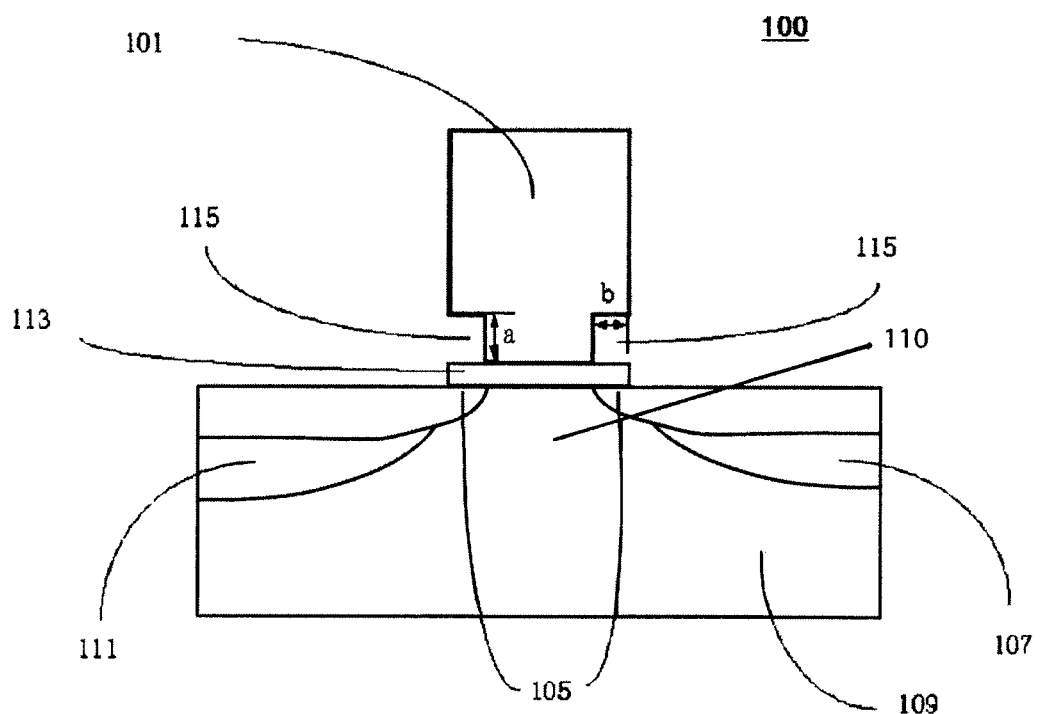
FIG. 1 is a diagram showing an example of a semiconductor apparatus according to an embodiment of the present invention.

FIG. 1 shows an example of a semiconductor apparatus according to an embodiment of the present invention. The semiconductor apparatus comprises an N-channel strained semiconductor device 100.

The N-channel strained semiconductor device 100 comprises a substrate 109, a gate structure over the substrate 109, the gate structure including a dielectric layer 113 over the substrate 109 and agate 101 over the dielectric layer 113. A recess 115 is formed at a lower end portion of at least one of two sides of the gate 101, the two sides being adjacent to a source region and a drain region. As would be appreciated by one skilled in the related art, the substrate 109 can have a source region 107 and a drain region 111 corresponding to the gate (or the gate structure), as well as a channel region between the source region and the drain region. Preferably, the substrate can further have an LDD region 105 as well.

Figure 2:
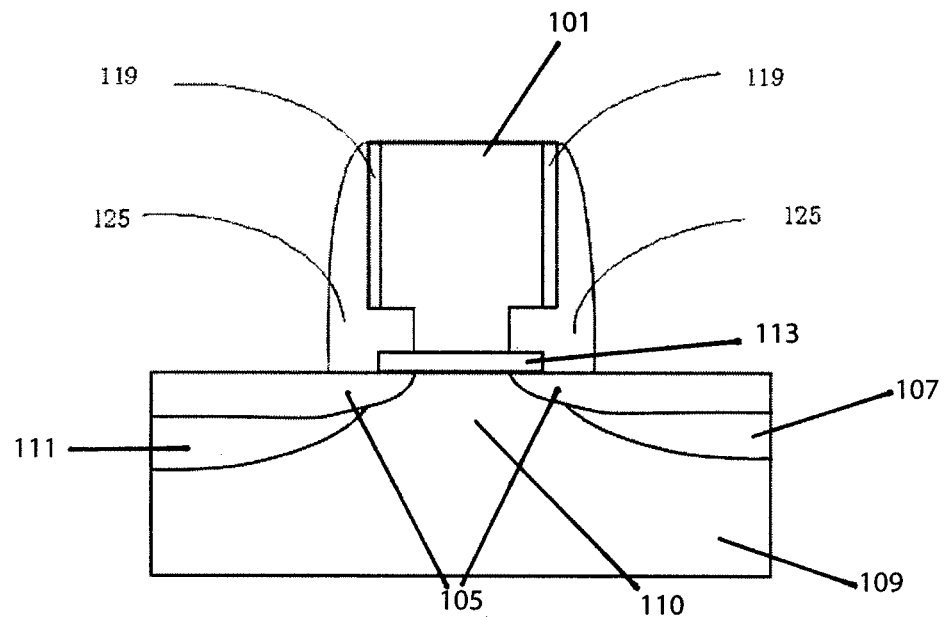
FIG. 2 is a diagram showing another embodiment of a semiconductor apparatus according to the present invention.

In another example of this embodiment, the gate structure further comprises sidewall 119 above a corresponding or respective recess and on at least one side surface of the gate 101, as shown in FIG. 2. For example, the sidewall may be formed from silicon nitride, silicon oxide, silicon nitride oxide, or multi-layers of the above materials.

During the process for forming the semiconductor apparatus, the gate structure is used for a stressing process on the channel region such that the channel region can have an enhanced strain. The stressing process will be described in detail below with reference to FIG. 3.

The channel region of the N-channel strained semiconductor device according to the present invention can have enhanced strain.

In some specific implementations of this embodiment, the gate 101 can be a metal gate or a poly-silicon gate, and the dielectric layer 113 can independently serve as a gate dielectric layer. However, in some other implementations, the gate 101 can be a dummy gate (such as but not limited to a poly-silicon) which will be removed later. In such case, the dielectric layer 113 may be removed, or may serve as a part of a gate dielectric layer in the final device.

In addition, although the dielectric layer 113 is shown as being below a lower surface of the gate 101 and extending beyond the lower surface in FIG. 1, the present invention is not limited thereto. In some implementations of the present invention, the dielectric layer 113 can be below the lower surface of the gate 101 and not extend substantially beyond the lower surface.

In a preferred implementation of this embodiment, the recess 115 is adjacent to the dielectric layer 113 such as shown in FIG. 1. Although the recess is shown as having a rectangular shape in the figures, one skilled in the art would appreciate that such a shape is merely for facilitating explanation of the principles of the present invention. In an operable device, the shape of the recess may depart from an ideal rectangle, and, for example, may be a shape having curvature in cross section. It should be understood that such shapes do not depart from the spirit and scope of the present invention.

In some preferred examples of the present invention, the recess can be formed such that the vertical size (see FIG. 1) thereof is less than or equal to a quarter (¼) (25%) of the vertical size of the gate. In some preferred examples of the present invention, the recess can be formed such that the lateral size (see FIG. 1) thereof is less than or equal to a fifth (⅕) (20%) of the lateral size of the gate.

In a more preferred embodiment, the substrate further comprises an LDD region. In such a case, the recess can be formed such that the lateral size b thereof is less than or equal to the lateral size of a portion of the LDD region that is located below the gate.

Other components of the N-channel strained semiconductor device not necessary for the present invention are not illustrated or described herein.

The embodiment of the present invention described above can be freely combined with the embodiments described below. A preferred method for manufacturing a semiconductor apparatus incorporating features of the present invention are described in conjunction with FIGS. 3-6.

In the method for manufacturing a semiconductor apparatus according to the embodiments of the present invention described in conjunction with FIGS. 3-6 below, the semiconductor apparatus comprises an N-channel semiconductor device.

A substrate 109 is provided. A gate structure for the N-channel semiconductor device is formed over the substrate 109. The gate structure includes a dielectric layer 113 over the substrate 109 and a gate 101 (such as, a poly-silicon gate) over the dielectric layer 113. A recess 115 is formed at a lower end portion of at least one of two sides of the gate 101 that are adjacent to a source region and a drain region.

Figure 3:
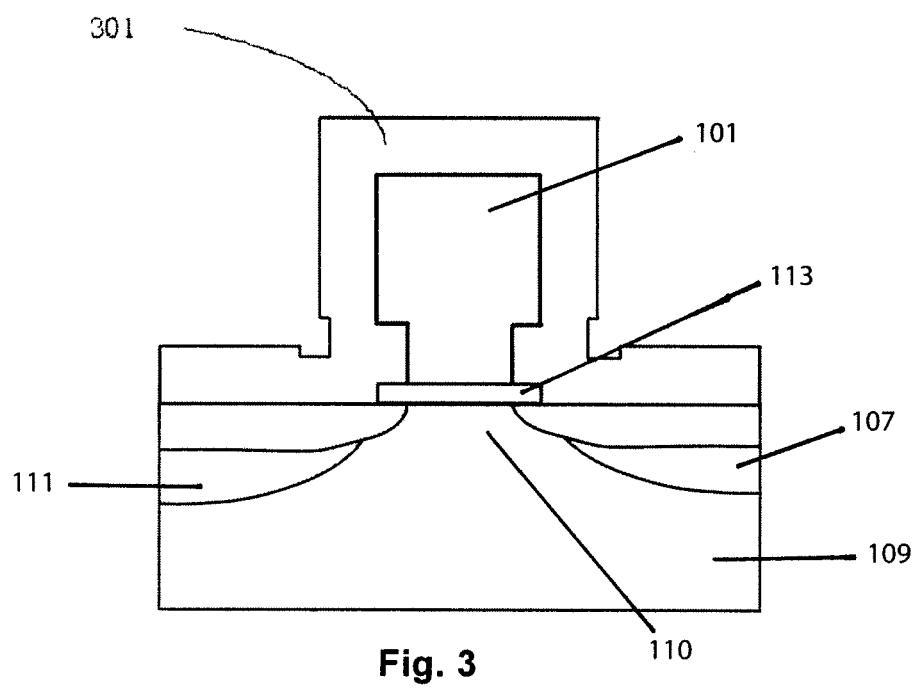
FIG. 3 is a diagram showing a stressing process as part of a method for manufacturing a semiconductor apparatus according to an embodiment of the present invention.

Next, a stressing process is performed. In a particular implementation, as shown in FIG. 3, the stressing process comprises covering the substrate 109 and the gate structure and filling the recess with a stress material 301; and annealing the stress material 301. In one particular embodiment, the stress material 301 is, for example, silicon nitride. The silicon nitride can be applied by CVD. However, the present invention is not limited thereto. One skilled in the art can employ any other suitable methods or stress materials in accordance with the teachings of the present invention. For example, a thermal CVD method can be adopted to deposit silicon nitride such that the annealing step is unnecessary.

In another particular implementation, the semiconductor apparatus can further comprise a P-channel semiconductor device. More specifically, a gate structure for a P-channel semiconductor device can be formed over the substrate. In such case, the stressing process also comprises, after covering the substrate and the gate structure, filling the recess with a stress material and before annealing, removing the stress material over the portion of substrate that covers the region for the P-channel semiconductor device. When thermal CVD is employed, it is preferable that the silicon nitride deposited by thermal CVD not affect the P-channel device (if present). For example, it is preferable that the silicon nitride deposited by thermal CVD does not cover or does not directly cover the region of the P-channel device.

After the stressing process is complete, the stress material can be removed.

It should be understood that descriptions of other components or details that are known in the art or are not necessary for the present invention are omitted. For example, as known by one skilled in the art, the substrate 109 can further include a source region 107 and a drain region 111 as well as a channel region 110 between the source region 107 and the drain region 111, which regions correspond to the gate structure, and preferably can have a LDD region 105 as well.

Figure 4:
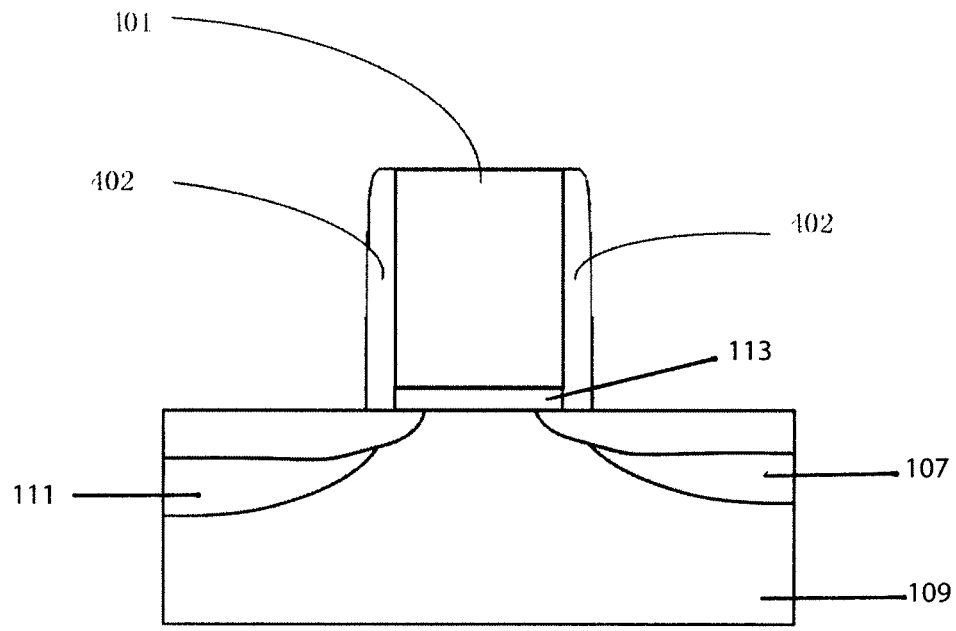
FIGS. 4-7 are diagrams showing a specific steps in a method for manufacturing a semiconductor apparatus according to an embodiment of the present invention.

In a particular implementation of this embodiment, the step of forming the gate structure comprises the following steps. An initial structure is formed over the substrate 109. The initial structure comprises a dielectric layer 113, a gate 401 above the dielectric layer 113, and a first gate spacer 402 used for the gate 401, such as shown in FIG. 4. In one particular implementation of the present invention, the gate 401 can be formed of poly-silicon. Generally, as known in the art, an LDD implantation can be performed after formation of an offset spacer (not specifically illustrated in the drawings) so as to form an LDD region, and source and drain regions implantations may be performed after formation of a main spacer on the offset spacer (not illustrated in the drawings) so as to form a source region 107 and a drain region 111. The offset spacer and the main spacer are collectively illustrated by the spacer 402. In some embodiments of the present disclosure, the main spacer can be removed after forming the source and drain and before forming the recess, depending on the materials of the spacers and the gate. It should be noted that the above is an exemplary sample for forming the gate structure and the substrate, and the present invention is not be limited to the above description. For example, in some cases, the LDD implantation can be performed after formation of the gate; thereafter, spacers can be formed on the sides of the gate, and then drain and source can be formed, for example, in a self-aligning manner.

Figure 5:
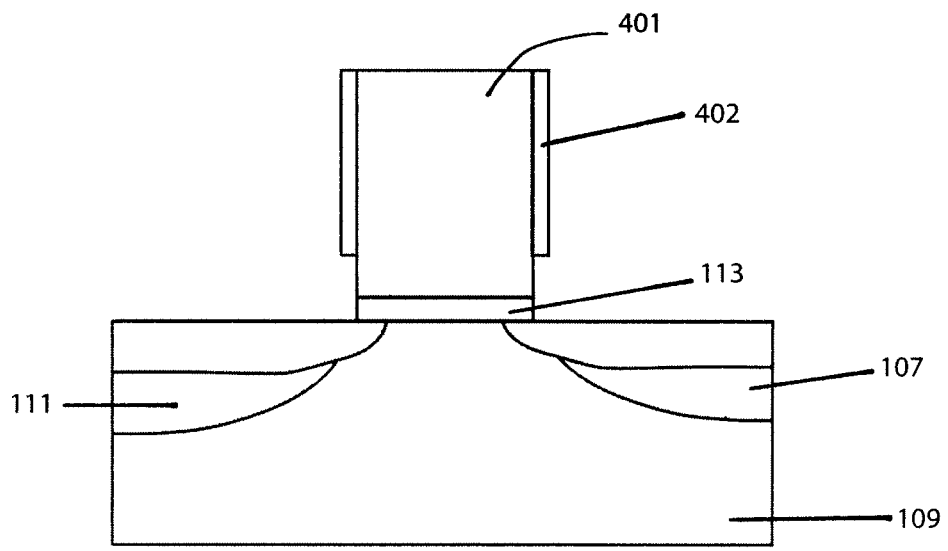

Next, the first gate spacer 402 is etched, for example, by reactive ion etching (RIE), such that the first gate spacer 402 is partially removed at its lower end to expose a portion of the gate 401, as shown in FIG. 5. As known by one skilled in the art, by adjusting the gas proportions during the etching process a relatively greater amount of by-products or etch polymers are produced and accumulated on a surface of a flat area while the by-products or etch polymers at corner positions are present in a relatively lesser amount such that the corner locations possibly etched through prior to the flat area.

Figure 6:
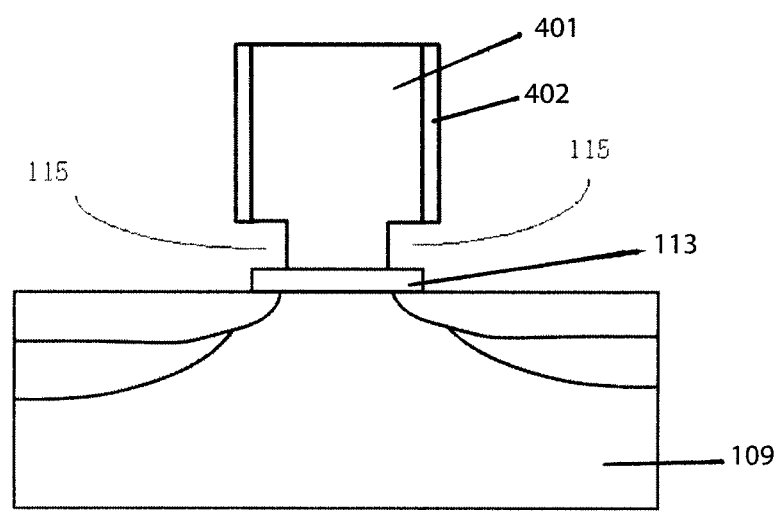

Next, the exposed portion of the gate 401 is etched to form a recess 115, as shown in FIG. 6. Preferably, a dry etch process in which the etch selectivity of the gate material with respect to the dielectric layer material is relatively high (that is, the etching rate for the gate material is significantly larger than the etching rate for the dielectric layer material) is employed. Preferably, etching the first spacer 402 and etching the gate 401 can performed in the same etching chamber, and for example, the etching of the first spacer 402 and the etching of the gate 401 can be performed by changing the compositions of etchant gases.

A recess 115 is preferably formed in both sides of the gate adjacent to the source region and the drain region. However, as described above, the present invention is not so limited. For example, the recess 115 may be formed in only one side of the gate.

It should be understood that the above etching processing is performed for the gate structure of the N-channel device. In the case where the semiconductor apparatus also comprises a P-channel device, the above etching processing can be carried out by covering the region for the P-channel device of the substrate with a patterned mask.

After the formation of the recess 115, a stressing process is performed. For example, as shown in FIG. 7, the stress material 701 is deposited over the substrate such that the deposited stress material covers the gate structure and fills the recess 115, and annealing is performed on the stress material.

After the stressing process, the stress material may be removed.

Figure 7:
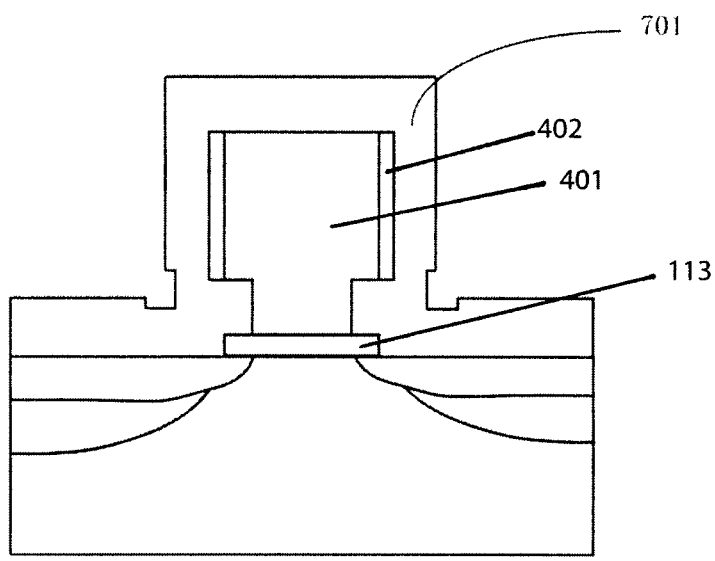
Figure 8:
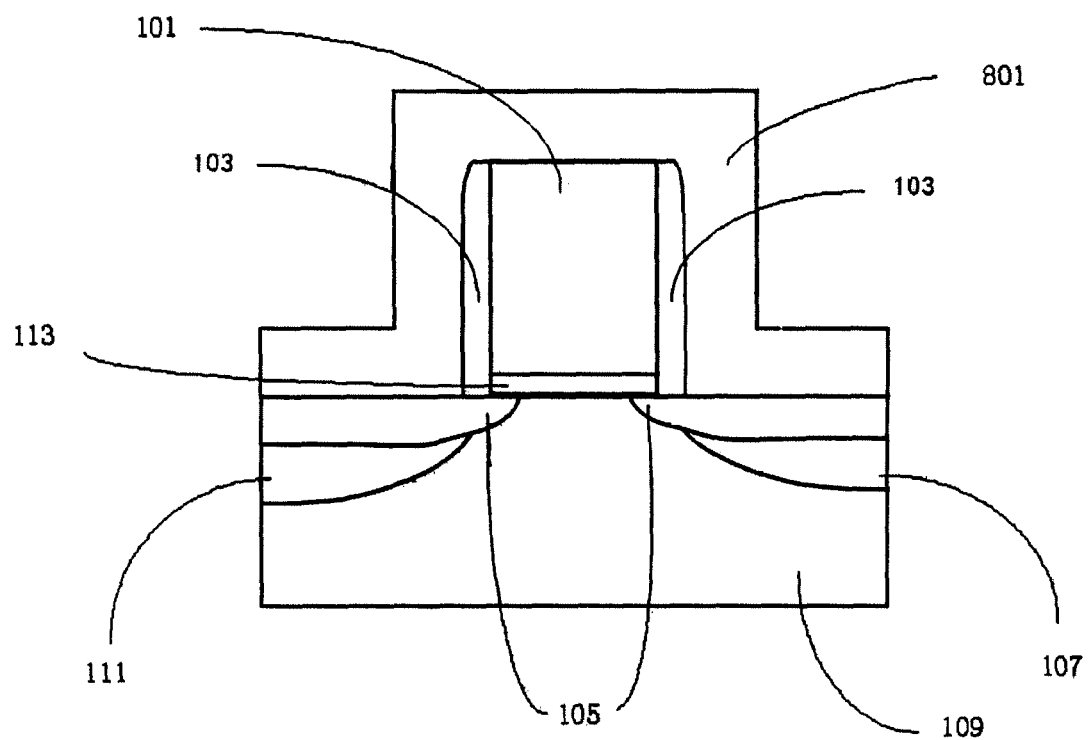
FIG. 8 is a diagram showing prior art N-channel strained semiconductor device.

Note that, as shown in FIGS. 5-7, a part of sidewall 402 remains over the side surface(s) of the gate and above the recess(es) 115. However, when performing the stressing process, the presence of absence the remaining part of sidewall is not important. In other words, irrespective of whether this partial sidewall is present or not during the stressing process, the technical effect of the present invention can be achieved. In addition, when removing the stress material 701 after the stressing process, if the sidewall 402 and the stress material 701 are a same material, such as, silicon nitride, the sidewall 402 would be removed as well. However, if the sidewall 402 and the stress material 701 are different materials, the sidewall may be maintained as a part of agate spacer in the final device.

After removing the stress material 701, preferably, a second gate spacer 125, (see FIG. 2) may be formed. However, as known by one skilled in the art, subsequent processes, like the formation of a dielectric interlayer and a contact process cycle can be continued. These subsequent processes are not part of the present invention, and thus the descriptions thereof are omitted.

In another embodiment of the present invention, the gate 101 can be a dummy gate, which can be removed after the stressing process, as is performed in the conventional gate-last process, as would be understood by one skilled in the art. For example, after removing the stress material 701, a second gate spacer 125 can be formed, and then a dielectric interlayer is formed. The dielectric interlayer is subjected to CMP (chemical mechanical polishing) so as to expose an upper surface of the dummy gate, and then the dummy gate can be removed. Next, a dielectric layer (such as dielectric of high-K) and metal gate material can be deposited so as to form a metal gate.

A method for manufacturing a semiconductor apparatus according to the embodiments of the present invention has been described above in conjunction with FIGS. 3-7. Although the said embodiment is preferably used for advanced semiconductor logic device manufacturing process, the present invention is not limited thereto.

For example, there are several methods known in the art for achieving the gate structure shown in FIGS. 2-6. For example, in another embodiment, the gate can be formed in two-steps in which a wide upper portion and a narrow lower end portion of the gate are respectively achieved. For example, a dielectric layer and a lower end portion of the gate are formed over the substrate, and LDD implantation is performed thereon. Then, a silicon oxide layer is deposited and CMP is performed to expose an upper surface of the gate; the material of an upper portion of the gate is deposited and then patterned.

According to the present invention, the channel region 110 of the N-channel semiconductor device has enhanced strain and, in many embodiments, is improved when compared to the prior art.

The embodiments of the present invention have been described above with reference to the drawings. It should be appreciated, however, that these embodiments are merely illustrative in nature and are not intended to limit the claims of this application. The embodiments can be arbitrarily combined without departing from the spirit of the present invention. For example, the present invention are not applicable only to the advanced semiconductor logic device process, but can also be adaptably applied to various processes. In addition, the embodiments and details of the present invention can be modified by one skilled in the art in light of the teachings herein, without departing from the scope thereof. Therefore, all these modifications are within the spirit and scope of the present invention as defined by the attached claims.

What is claimed is:

1. a method for manufacturing a semiconductor apparatus, comprises:
   providing a substrate;
   forming a gate structure for an N-channel semiconductor device over the substrate, wherein forming a gate structure for an N-channel semiconductor device comprises:
   forming an initial structure over the substrate, comprising:
   forming a dielectric layer over the substrate, and a gate over the dielectric layer, and forming a gate spacer covering vertical side surfaces of the gate and the vertical side surfaces of the dielectric layer;
   etching the gate spacer such that the gate spacer is partially etched at its lower end to expose a portion of the vertical side surfaces of the gate and the vertical side surfaces of the dielectric layer; and
   etching the exposed portion of the gate to form a recess, with respect to the gate dielectric layer, at a lower end portion of the side of the gate that is adjacent to a source region or a drain region; and
   depositing a stress material over the substrate and the gate structure.

2. The method according to claim 1, wherein the stressing process comprises:
   covering the substrate and the gate structure with a stress material so that the recess is filled with the stress material; and
   annealing the stress material.

3. The method according to claim 1, wherein the gate is a metal gate, a poly-silicon gate, or a dummy gate.

4. The method according to claim 1, wherein a lateral size of the recess is less than or equal to a fifth of a lateral size of the gate.

5. The method according to claim 1, wherein a vertical size of the recess is less than or equal to a quarter of a vertical size of the gate.

6. The method according to claim 1, wherein the substrate further comprises a lightly doped (LDD) region, wherein a lateral size of the recess is less than or equal to a lateral size of a portion of the LDD region that is below the gate.

7. The method according to claim 2, further comprising: removing the stress material.

8. The method according to claim 1, further comprising: after forming a dielectric layer over the substrate and a gate over the dielectric layer, and before forming a gate spacer covering a side of the gate, performing a lightly doped (LDD) implantation procedure to form a LDD region.

9. The method according to claim 8, further comprising: after forming the gate spacer covering a side of the gate, forming a drain and a source in a self-aligned manner.

* * * * *